(12) United States Patent  (10) Patent No.: US 8,901,697 B2
Stenson  (45) Date of Patent: Dec. 2, 2014

(54) INTEGRATED CIRCUIT HAVING A SEMICONDUCTING VIA; AN INTEGRATED CIRCUIT INCLUDING A SENSOR, SUCH AS A PHOTOSENSITIVE DEVICE, AND A METHOD OF MAKING SAID INTEGRATED CIRCUIT

(75) Inventor: Bernard Patrick Stenson, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 93 days.

(21) Appl. No.: 13/422,628

(22) Filed: Mar. 16, 2012

(65) Prior Publication Data

US 2013/0241021 A1 Sep. 19, 2013

(51) Int. Cl.
*H01L 31/075* (2012.01)

(52) U.S. Cl.
USPC ............ 257/435; 257/458; 257/466; 257/461

(58) Field of Classification Search
USPC ........ 438/57, 71, 60; 257/290, 228, 226, 444, 257/435, 447, 458
See application file for complete search history.

(56) References Cited

U.S. PATENT DOCUMENTS

| | | | |
|---|---|---|---|
| 6,175,141 B1 * | 1/2001 | Hofbauer et al. | 257/444 |
| 6,426,991 B1 * | 7/2002 | Mattson et al. | 378/19 |
| 6,836,020 B2 * | 12/2004 | Cheng et al. | 257/774 |
| 6,930,336 B1 * | 8/2005 | Merrill | 257/292 |
| 7,026,701 B2 * | 4/2006 | Scales et al. | 257/449 |
| 7,242,069 B2 * | 7/2007 | Bui et al. | 257/443 |
| 7,528,458 B2 * | 5/2009 | Wilson et al. | 257/458 |
| 7,576,404 B2 * | 8/2009 | Wilson et al. | 257/447 |
| 7,601,556 B2 * | 10/2009 | Wilson et al. | 438/57 |
| 7,608,906 B2 * | 10/2009 | Tennant | 257/461 |
| 7,943,409 B2 * | 5/2011 | Hannebauer | 438/48 |
| 7,968,964 B2 * | 6/2011 | Bui et al. | 257/447 |
| 8,030,728 B2 * | 10/2011 | Iwai et al. | 257/459 |
| 8,058,091 B2 * | 11/2011 | Wilson et al. | 438/57 |
| 8,159,049 B2 * | 4/2012 | Hietanen | 257/621 |
| 8,168,933 B2 * | 5/2012 | Byun et al. | 250/208.1 |
| 8,257,997 B2 * | 9/2012 | Chen et al. | 438/71 |
| 8,278,729 B2 * | 10/2012 | Bui et al. | 257/461 |
| 8,440,490 B2 * | 5/2013 | Adkisson et al. | 438/57 |
| 2001/0032979 A1 * | 10/2001 | Rhodes | 257/59 |
| 2004/0173865 A1 * | 9/2004 | Scales et al. | 257/449 |
| 2004/0180461 A1 * | 9/2004 | Yaung et al. | 438/48 |
| 2005/0101100 A1 * | 5/2005 | Kretchmer et al. | 438/424 |
| 2005/0227402 A1 * | 10/2005 | Chang et al. | 438/57 |
| 2006/0124976 A1 * | 6/2006 | Adkisson et al. | 257/292 |
| 2007/0085117 A1 * | 4/2007 | Wilson et al. | 257/291 |
| 2009/0127667 A1 | 5/2009 | Iwata | |
| 2010/0148221 A1 * | 6/2010 | Yu et al. | 257/225 |
| 2010/0323468 A1 * | 12/2010 | Hannebauer | 438/57 |
| 2011/0037133 A1 * | 2/2011 | Su et al. | 257/432 |
| 2011/0042576 A1 * | 2/2011 | Wilson et al. | 250/370.11 |
| 2011/0079704 A1 * | 4/2011 | Yu et al. | 250/208.1 |
| 2011/0221044 A1 | 9/2011 | Danek et al. | |
| 2011/0227158 A1 | 9/2011 | Zhu | |
| 2012/0068225 A1 * | 3/2012 | Gravrand et al. | 257/184 |

(Continued)

*Primary Examiner* — Steven Loke
*Assistant Examiner* — David Goodwin
(74) *Attorney, Agent, or Firm* — Knobbe, Martens, Olson & Bear, LLP

(57) ABSTRACT

An integrated circuit having an insulated conductor or within a semiconductor substrate and extending perpendicular to a plane of a semiconductor wafer or substrate on which the integrated circuit is fabricated, the conductor comprising a first region of doped semiconductor extending between a first device or a first contact and a second device or a second contact.

24 Claims, 16 Drawing Sheets

(56) References Cited

U.S. PATENT DOCUMENTS

| | | |
|---|---|---|
| 2012/0074583 A1 | 3/2012 | Dao |
| 2012/0122261 A1* | 5/2012 | Adkisson et al. ............... 438/57 |
| 2012/0280109 A1* | 11/2012 | Mao et al. .................. 250/208.1 |
| 2013/0015502 A1* | 1/2013 | Fox et al. ...................... 257/200 |
| 2013/0062604 A1* | 3/2013 | Kautzsch ........................ 257/48 |
| 2013/0119503 A1* | 5/2013 | Chabuel et al. ............... 257/443 |
| 2013/0119521 A1* | 5/2013 | Chen ............................. 257/621 |
| 2013/0168750 A1* | 7/2013 | Ikhlef et al. .................. 257/292 |

\* cited by examiner

ETCH BACK

FORM IN-SITU DOPED POLYSILICON

INTEGRATED CIRCUIT HAVING A SEMICONDUCTING VIA; AN INTEGRATED CIRCUIT INCLUDING A SENSOR, SUCH AS A PHOTOSENSITIVE DEVICE, AND A METHOD OF MAKING SAID INTEGRATED CIRCUIT

FIELD

The present disclosure relates to an integrated circuit having a semiconducting via, to an integrated circuit including a sensor, such as a photosensitive device, and a method of making the integrated circuit.

BACKGROUND

It is known that photons interact with semiconductor to generate electron-hole pairs. The carriers may be accelerated by the electric field within the depletion region of a PN junction giving rise to a photo generated current. However such photo generated electrons and hole pairs have a diffusion length over which a proportion of the electron-hole pairs recombine. The diffusion length shortens (as does the lifetime of the isolated charges) with increasing dopant concentration within the semiconductor. Therefore low dopant concentration or densities give rise to longer lifetimes and longer diffusion lengths. However the bulk resistivity of the silicon substrate also increases with reduced doping and hence there is a conflict between the desire to pass current through the semiconductor and the desire to have a long diffusion length.

Manufacturers of conventional photodetectors have addressed the diffusion length problem by using very thin semiconductor wafers. Wafer thicknesses of around 150 microns have been used. However such thicknesses make the wafer susceptible to processing and mechanical damage. Such thicknesses are also not routinely handled by semiconductor fabricators involved in the manufacture of integrated circuits and hence the cost of using such thin wafers is significantly more than the cost of using standard thickness wafers, of the type used in the manufacture of integrated circuits.

The problem of fragility exists with many sensor arrangements and hence it is desirable to use thicker semiconductor wafers where possible. Often is it desirable for sensors, such as micro-machined microphones, strain gauges or other sensors using techniques such as etching to form bridge, cantilevered or other such structures, to be formed on one side of a wafer with the electronic components being formed on another side of a wafer for protection. This gives rise to a need to provide a conductive path from the sensor, be it an optical sensor or some other sensor formed within the semiconductor wafer, to the electronic components.

SUMMARY

According to a first aspect of the disclosure, there is provided an integrated circuit having an insulated conductor within a semiconductor substrate and extending perpendicular to a plane of a semiconductor wafer or substrate on which the integrated circuit is fabricated, the conductor comprising a first region of doped semiconductor extending between a first device or a first contact and a second device or a second contact.

Advantageously the first device or first contact is on a first side of the semiconductor substrate and the second device or second contact is on a second side the semiconductor substrate.

In a first embodiment, there is provided a sensor, comprising: a semiconductor substrate having a first side and a second side; a sensor formed within the semiconductor substrate at or adjacent the first side of the semiconductor substrate; and a semiconductor via in electrical contact with the sensor; wherein the first side of the substrate is arranged, in use, to be exposed to a measurand to which the sensor is sensitive, and the conductor extends between the sensor and the second side of the semiconductor substrate.

In further embodiment, there is provided a photosensitive device comprising: a semiconductor substrate having a first side and a second side; a photodetector formed within the semiconductor substrate; and a conductor in an electrical contact with the photodetector; wherein the first side of the semiconductor substrate is arranged, in use, to receive photons and the conductor extends between the photodetector and the second side of the semiconductor substrate.

It is thus possible to provide a photosensitive device where the photodetector is buried within the semiconductor substrate, but can be placed adjacent the first side of the semiconductor substrate. The connections between the photodetector and other circuits or devices that, in use, are responsive to the photodetector can be made by forming the conductor through the semiconductor substrate, said conductor extending away from the first side of the semiconductor substrate. Such an arrangement has the advantage that the photosensitive device can be formed on a thicker wafer. This in turn means that the wafer can be a standard thickness compatible with the processes offered by semiconductor fabricators commonly used for the formation of integrated circuits. Such an approach can significantly reduce the cost of manufacture. It can also facilitate forming other electronic circuitry such as amplifiers, multiplexers, analog to digital converters or other signal processing elements on the same substrate. Such an arrangement can also avoid the need to fabricate conductive structures or electrodes on the first side of the substrate. This avoids having to fabricate structures that may reflect or attenuate a photon flux (or indeed absorb individual photons) that might otherwise reach the photodetector.

Advantageously the photodetector can be formed within the semiconductor substrate adjacent the first side of the semiconductor substrate. The photosensitive device may, for example, be a photodiode formed in the semiconductor substrate just beneath or at the first side of the semiconductor substrate.

Advantageously the photodetector can comprise a first photodetector semiconductor region formed within the semiconductor substrate. The semiconductor substrate around the first photodetector semiconductor region may define a first substrate region which comprises a first type of semiconductor having a first dopant concentration. The first photodetector semiconductor region comprises a second type of semiconductor having a dopant concentration greater than the first dopant concentration. Such an arrangement forms a PN junction. Preferably the conductor is formed by a doped volume of semiconductor extending between the first photodetector semiconductor region and the second surface of the substrate or a contract at or adjacent the second surface. The conductor may, for example, be formed as a finger or column of doped semiconductor extending from the photodiode towards the second surface.

Advantageously a plurality of spaced apart photodetectors can be connected together to form a single pixel within a photodetector array. Such an arrangement can enhance the response time of the pixel. The capacitance of the pixel within the photodetector array can be reduced by reducing the size of the first semiconductor regions formed within the semiconductor substrate. The sensitivity of the device is not proportionately reduced because photons entering into the first substrate region between adjacent first semiconductor regions can give rise to electron hole pairs producing a photo-inducted current which can be detected by an adjacent first semiconductor region.

The conductors, which can be regarded as being vias, are isolated from the substrate. Such isolation can be achieved by the formation of an insulating layer around the conductor, such as a layer of silicon dioxide, or by the formation of a reverse biased PN junction between the conductor and the semiconductor substrate.

Advantageously optical isolation can be provided between adjacent pixels by forming optical barriers at the first surface of the semiconductor substrate. The optical barriers may extend from the first surface of the semiconductor substrate into the body of the semiconductor substrate. Optical barriers may, for example, be formed by discontinuities within the semiconductor substrate. An example of such a discontinuity is a trench.

Advantageously a plurality of photodetectors can be provided within the substrate and configured to provide a photodetector array in which the outputs of individual pixels can be selected for processing or for output. An optical element may be associated with the photosensitive device. The optical element may, for example, be a scintillator such that the photosensitive device is sensitive to energetic photons such as X-rays and gamma rays.

A conductor may be in the form of a conductive finger. The conductor may extend through the substrate and may be used to connect to other sensors other than photodetectors. Thus, etching the surface of the first side of the substrate may allow the formation of bridge, cantilever or other structures that may flex or vibrate in response to a stimulus, such as force or sound or other pressure waves, or thermal effects, where such structures can capacitively couple to the conductive finger. Such an arrangement allows a variety of sensors to be formed at or adjacent the first side of the wafer and have signals pass through a doped channel to circuitry or connections formed at or adjacent a second side of the wafer, or at the least more remote from the first side of the wafer.

According to a further aspect of the disclosure there is provided a method of forming a connection between a first layer in a semiconductor substrate and a second layer in a semiconductor substrate, said second layer not being contiguous with the first layer, the method comprising the steps of: a) etching a trench that extends through the semiconductor substrate between the first layer and the second layer, said trench extending through any intermediate layers; and b) depositing doped semiconductor in the trench.

BRIEF DESCRIPTION OF THE DRAWINGS

Some embodiments will now be described, by way of non-limiting example only, with respect to the accompanying drawings, in which.

DETAILED DESCRIPTION OF CERTAIN EMBODIMENTS

Figure 1:
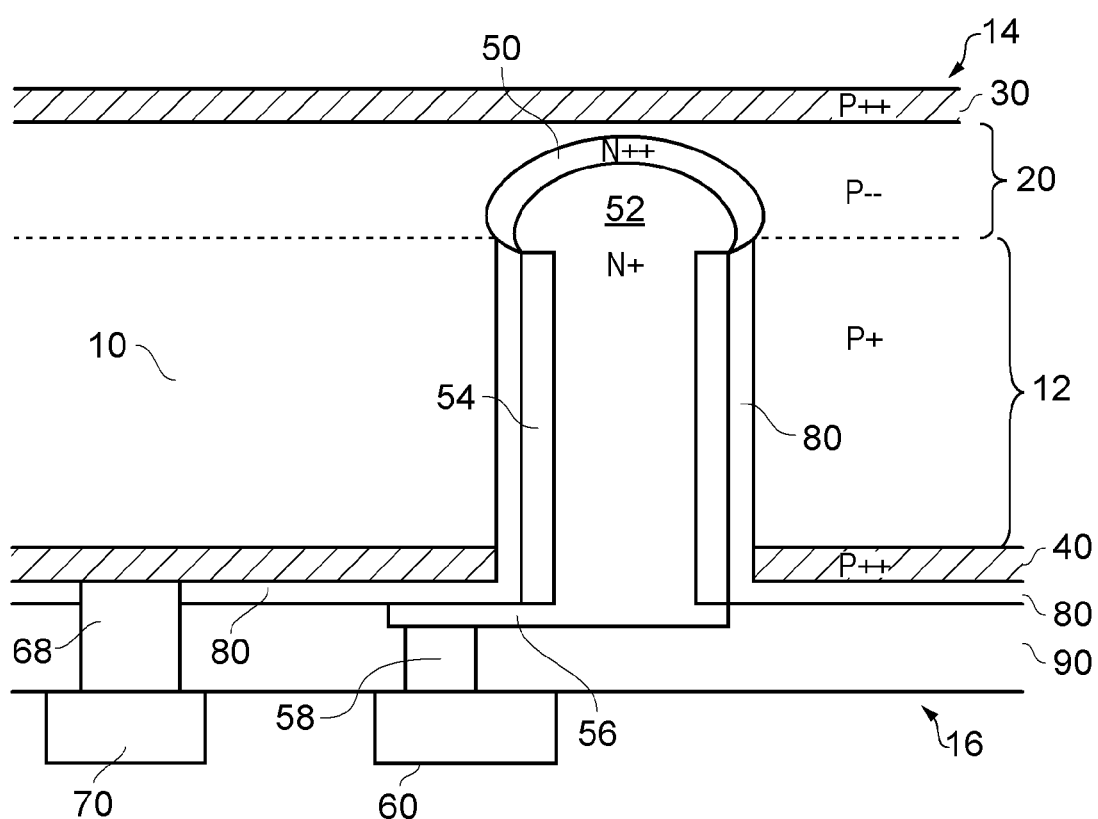
FIG. 1 schematically illustrates a photodetector constituting a first embodiment.

FIG. 1 is a cross section through a photosensitive device in accordance with a first embodiment. The photosensitive device comprises a substrate 10 formed of a semiconductor including a bulk region 12. The substrate has a first side 14 and a second side 16. The substrate is, in this example, roughly $760 \times 10^{-6}$ m thick. This is a wafer thickness commonly used in integrated circuit fabrication. More generally wafer thicknesses may be expected to range between $625 \times 10^{-6}$ m for 5 inch (130 mm) wafers to $925 \times 10^{-6}$ m for 450 mm wafers. As is known to the person skilled in the art, semiconductor devices are formed by taking a group 4 element, most commonly but not exclusively silicon, and doping it with acceptor impurities or donor impurities from groups 3 and 5 of the periodic table to form P-type or N-type regions. For generality within this document, regions may be referred to as being of a first type of semiconductor or of a second type of semiconductor. In these instances the first type is one of a N-type or a P-type semiconductor and the second type is the other one of the N type or P-type semiconductor.

For the example device described with respect to FIG. 1, and to aid the reader, the first type is an N type and the second type is a P type (but the disclosure is not limited to this particular choice). The semiconductor substrate is doped so as to form a second type, that is a P-type, semiconductor.

As is known to the person skilled in the art, the dopant density, whether that be of an acceptor or of a donor type can be varied within the semiconductor substrate. A commonly used nomenclature is to use "+" and "−" signs to indicate how the dopant concentration varies from an arbitrary doping density. Thus, as used herein "P+" represents a "normal" doping concentration. Whilst the doping concentration may vary from process to process, "+" typically represents an order of $10^{15}$ doping atoms per cm$^3$. The term "P++" represents a higher doping concentration than "P+". A typical dopant concentration for "P++" is around the order of $10^{19}$ dopants per cm$^3$. The term "P−−" represents a lightly doped region of semiconductor with a typical dopant concentration of around $5 \times 10^{13}$ doping atoms per cm$^3$. FIG. 1 also includes a N+ doped region forming the conducting finger which is typically doped at an order of $10^{17}$ atoms per cm$^3$. The ranges of dopant concentration disclosed herein are not intended to be limiting and should not be construed as such but are given merely by way of background information in order to aid the reader's understanding.

A similar nomenclature applies with respect to the other N-type regions of semiconductor.

Also, for descriptive convenience only, terms such as "above" and "below" refer to the examples shown in the Figures, but it is apparent than in any actual device the substrate may be oriented in any arbitrary orientation. As such descriptive terms such as above, below, beside, etc are refer to the orientations shown in the figures.

Within the substrate 10 a first substrate region, generally designated 20, is formed by lightly doped region designated P−−. The first substrate region 20 is formed adjacent, but not at, the first surface 14 of the semiconductor substrate 10. The first substrate region 20 may be formed by epitaxial deposition above the P+ region 12 that forms the bulk of the substrate 10. A relatively thin P++ region 30 may be formed above the P−− first substrate region 20, as shown in FIG. 1. Such a region can inhibit surface recombination of the electron-hole pairs generated by the interaction of a photon and the lightly doped first substrate region 20. In this embodiment the region 30 is around $2 \times 10^{-6}$ m thick. Other thicknesses may be used.

Additionally a relatively heavily doped P++ region 40 may be formed at the second side 16 of the semiconductor substrate 10, e.g. beneath the bulk region 12, such that the P+ region 12 and the P−− region 20 are enclosed between the P++ regions 30 and 40. The P++ region 40 used to form a relatively low resistance region to make an electrical connection to the bulk region 12 of the substrate 10.

In order to form the photodetector a first photodetector semiconductor region of N++ semiconductor 50 can be formed within the lightly doped P−− region 20 adjacent, but separated from, the first surface 14 and the P++ region 30. In an example device the separation between regions 50 and 30 is less than $100 \times 10^{-6}$ m. A column of N+ type semiconductor 52 forming a via extends from the N++ first semiconductor photodetector region 50 away from the first surface 14, through the P+ region 12 of the semiconductor substrate, and towards the second surface 16. The N+ region 52 can, in three dimensions, be regarded as forming a column of N+ semiconductor within the P+ region 12. The N+ column (in this example) is enclosed by an insulating sheath 54 around the column 52 thereby serving to provide electrical isolation between the column 52 and the P+ region 12 of the semiconductor substrate 10. A foot 56 the N+ region 52 provides a connection between the N+ region 52 and a metal contact 60 (which can be regarded as a photodetector contact) by way of a very highly doped N-type contact region 58. The very highly N type doped contact region can have higher doping concentration than the N++ region Similarly the P++ region 40 can provide electrical contact with a further metal connector 70 (which can be regarded as a substrate contact) in the way of a very heavily P-typed intermediate region 68, which is more heavily doped than the P++ region 40. Alternatively regions 58 and 68 may be replaced by metallic contacts.

Returning to the structures surrounding the N+ region 52 that forms the connector or via, it can be seen that the insulating sheath 54 is separated from the lower P++ region 40 towards the base of the column by a layer of thermal oxide or polysilicon 80.

It can also be seen that a lowermost protective layer 90, for example of polysilicon is provided at the base of the device, on the second side 16.

In use, a bias voltage is provided by way of the contacts 60 and 70 so as to reverse bias the PN junction formed between the first semiconductor region 50 of N++ material and the P−− substrate region 20. Thus contact 60 acts as the cathode and contact 70 as the anode when a reverse bias is applied to the PN photodiode.

It can be seen that a feature of this arrangement is that it allows the active part of the photodetector, i.e. the PN junction, to be placed near the front light receiving surface (upper surface 14 as shown in FIG. 1) of the substrate 10, whilst allowing a doped region of semiconductor to form a connector to the second surface 16, which effectively acts as the rear side of the photosensitive device, or to other components formed on or adjacent the second side of the device.

Figure 2:
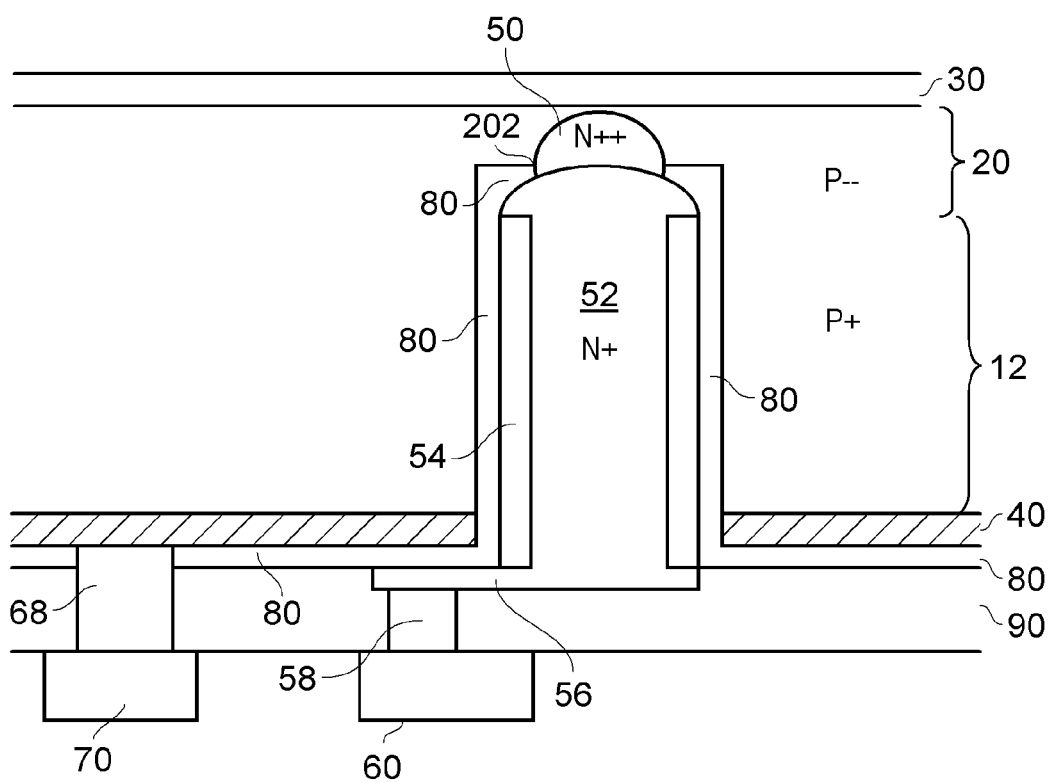
FIG. 2 schematically illustrates a photodetector constituting a second embodiment.

FIG. 2 schematically illustrates a second embodiment. It has many features that are similar to the arrangement shown in FIG. 1, and like reference numerals are used to describe like parts.

One difference in the device illustrated in FIG. 2 compared to the device illustrated in FIG. 1 is that the oxide or polysilicon layer 80 has been extended partially over the top of the column of N+ type material 52, so as to define a smaller aperture 202 through which the first semiconductor region 50 of N++ material extends. This can provide a more compact first photodetector semiconductor region, which in turn limits the spatial extent of the depletion region around the first semiconductor region 50, and hence can reduce the capacitance of the device.

The structures described herein can also have the advantage of being comparatively inexpensive to manufacture. A significant cost can be incurred at each process step, and in particular activities such as grinding material off the semiconductor wafer or turning it over can add significant costs. The embodiments discussed herein can reduce the number of these processing steps. Additionally or alternatively the embodiments discussed can allow thicker, and hence more robust, wafers to be used during manufacture.

Figure 3:
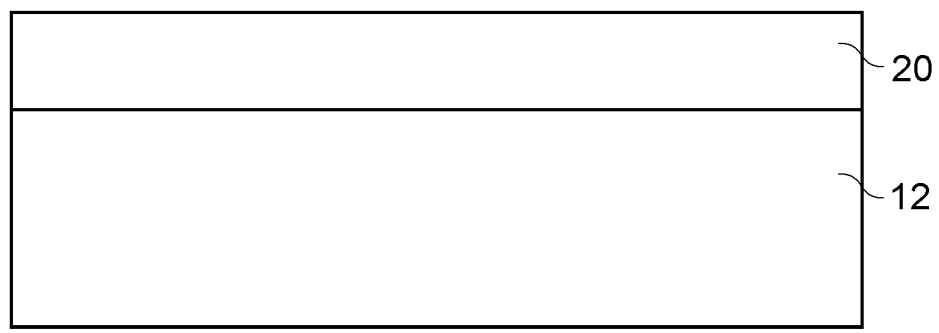
FIG. 3 illustrates a starting configuration for a semiconductor substrate (i.e. a wafer) during fabrication of a photodetector and a via.

The manufacture of the device shown in FIG. 2 starts with a wafer, as shown in FIG. 3 which comprises a bulk region 12 of P+ (or N+ in other implementations) semiconductor with a lightly doped epitaxial layer 20 formed thereon. Such an arrangement can be obtained from the wafer manufacturer.

Figure 4:
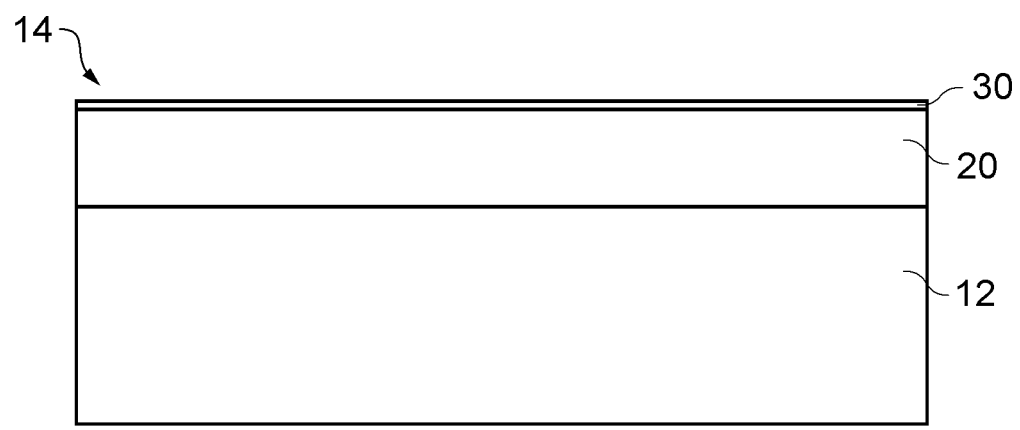
FIG. 4 shows the wafer of FIG. 3 after a highly doped layer has been formed at the first surface of the wafer.

Then, as shown in FIG. 4, a first processing step comprises doping the upper surface 14, for example by implanting ions into the upper surface 14, to form a more heavily doped P++ layer 30 which, in use, can act to inhibit carrier recombination at the surface. Various techniques for forming the P++ layer 30 are available to the person skilled in the art.

Figure 5:
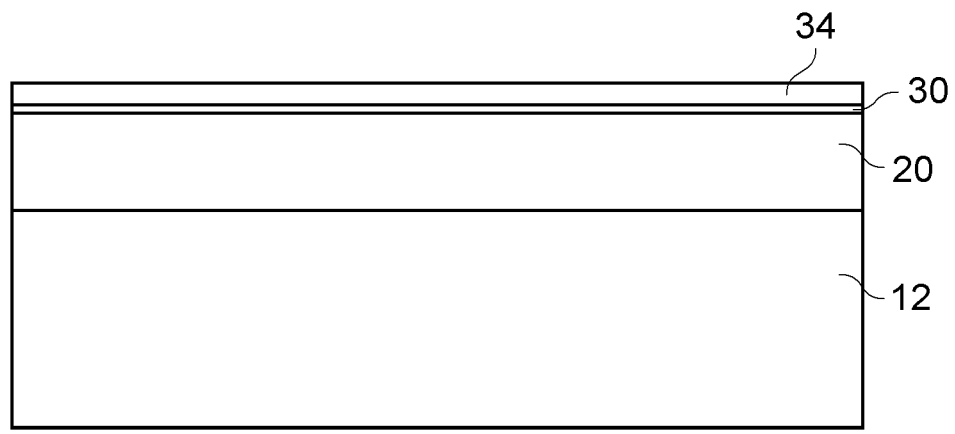
FIG. 5 shows the wafer at FIG. 4 after a protective layer has been formed over the highly doped layer.

Then, as shown in FIG. 5, during a surface processing step a layer of silicon oxide or polysilicon 34 is formed over the P++ layer 30 to protect the surface of the P++ layer 30.

This completes the processing at the front or first side of the wafer, and the wafer may now be turned over to expose its second side. This is not shown in the drawings, and instead the wafer is always shown in a frame of reference oriented with respect to the wafer such that the first side 14 is always uppermost.

Figure 6:
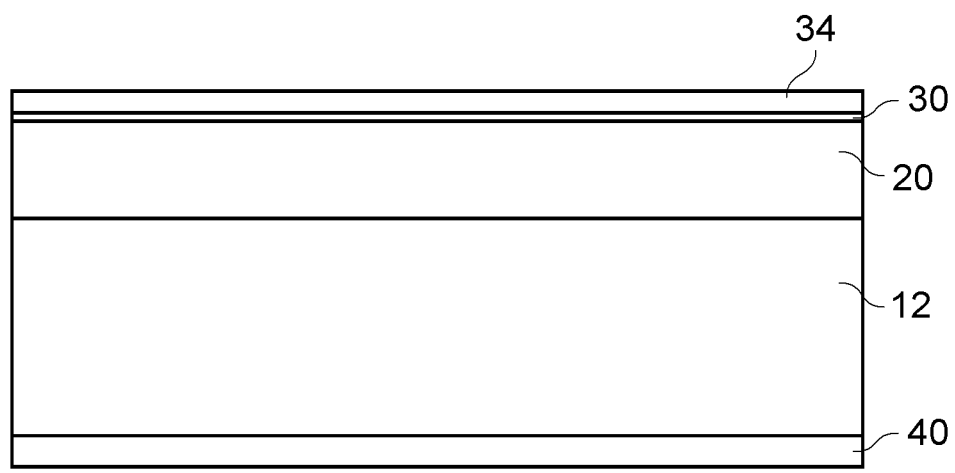
FIG. 6 shows the wafer of FIG. 5 after forming a doped layer on the second side of the wafer.

Once the wafer has been turned, the second side is scrubbed, cleaned, etched if necessary, and then implanted or otherwise processed to form the P++ layer 40, as shown in FIG. 6.

Figure 7:
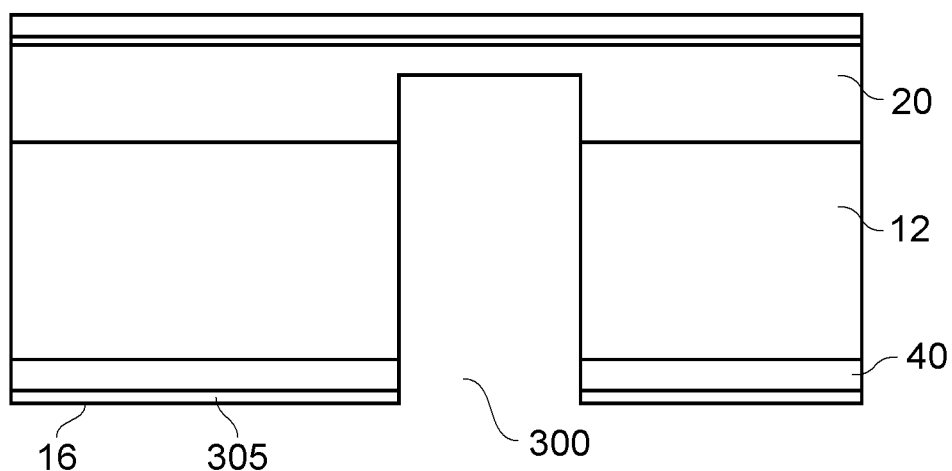
FIG. 7 shows the wafer of FIG. 6 after etching of a trench extending from the second side into the body of the wafer.

Next, and as shown in FIG. 7, a mask 305 is applied over the second surface 16 to define the position of a trench 300 which is then etched into the bulk region 12 and the first substrate region 20. This, in this example, defines the position of the photodetector and its connection to the second side 16 of the wafer. The mask can be, as known to the person skilled in the art, applied in a photolithographic process in which a photoresist is applied to the second surface of wafer, exposed, baked, developed and etched to remove selected regions of the photoresist. The etching into the wafer layers 12 and 20 can be performed using an anisotropic etch (as known to the person skilled in the art) so as to form a trench having relatively well defined walls. The mask may then be (and preferably is) removed.

Figure 8:
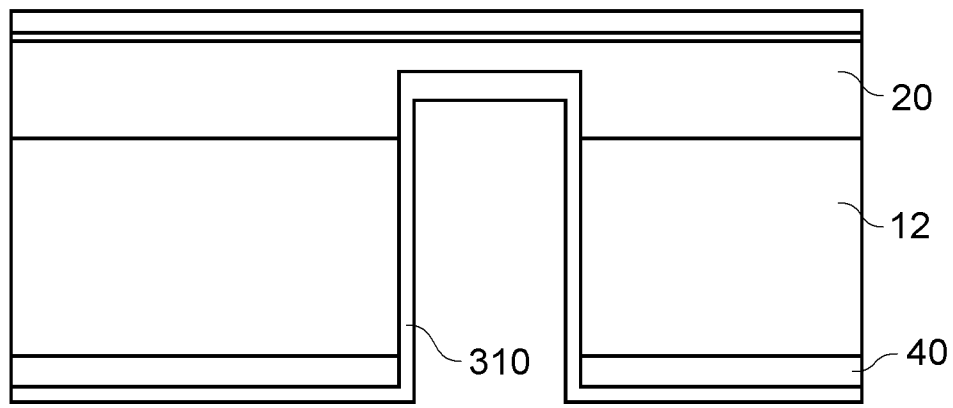
FIG. 8 shows the wafer of FIG. 7 after a first layer of insulating oxide has been formed on the walls of the trench and the second side of the wafer.
Figure 9:
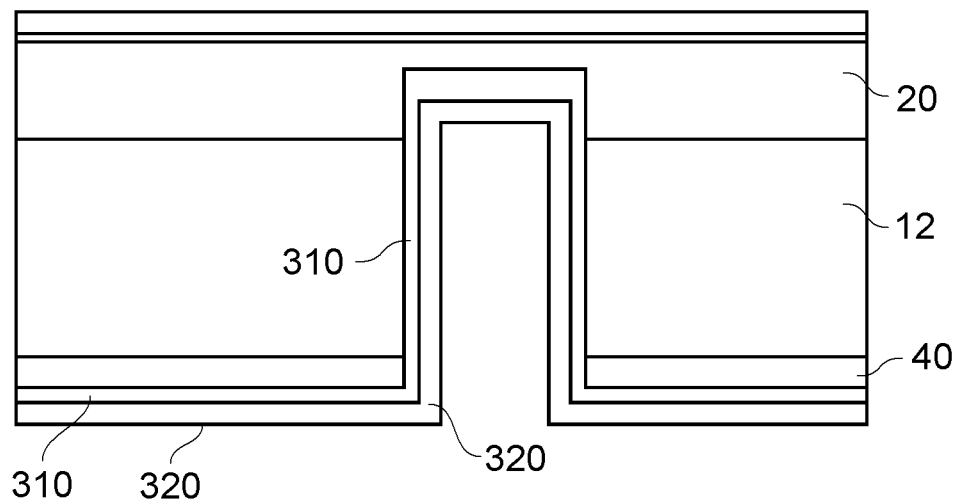
FIG. 9 shows the wafer of FIG. 8 after a further layer of insulating oxide has been formed.

Next, and as shown in FIGS. 8 and 9, two rounds of oxide formation and/or polysilicon deposition are formed in order to place an insulating sheath on the wall of the trench 300. The oxide layer is designated 310 and the polysilicon layer is designated 320 in the Figures. The oxide may be formed in a thermal oxidation step or process as known to the person skilled in the art. Advantageously an additional doping step may be performed so as to add a more heavily doped P+ region (not shown) along the edge of the trench. This can prevent inversion around the buried conductor, and hence stops the capacitance increasing due to the formation of an extended depletion region around the buried conductor.

Figure 10:
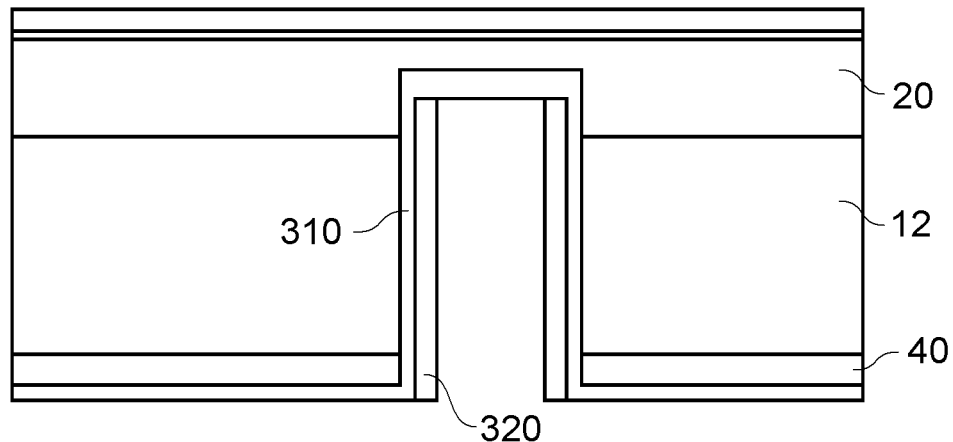
FIG. 10 shows the wafer of FIG. 9 after the insulating oxide on the second surface has been thinned.

Then as shown in FIG. 10 the polysilicon layer 320 on the second surface of the substrate may be etched back so as to thin it. This can be an etch back step in a series of etch back steps (and may involve directional etching) used to control the thickness of the structures at the second surface 16 of the wafer.

Figure 11:
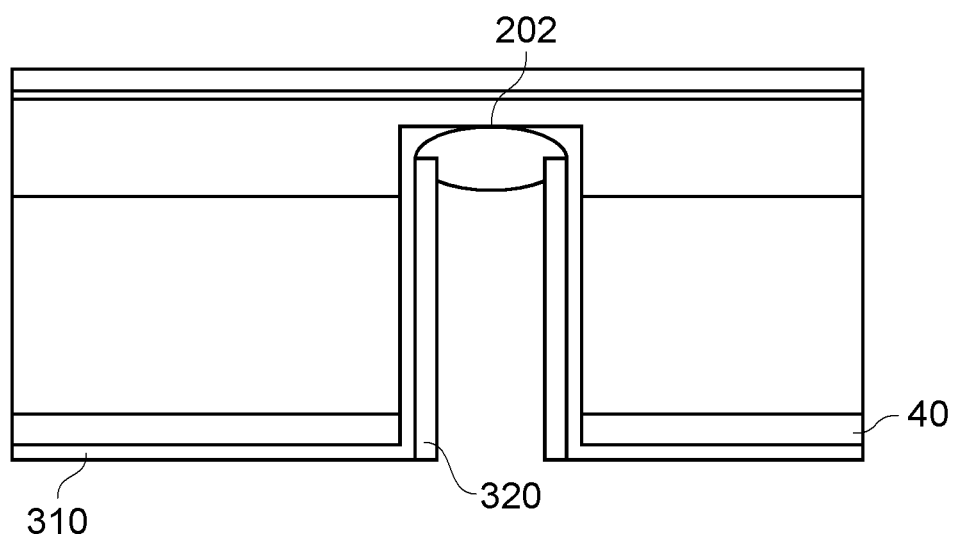
FIG. 11 shows the wafer of FIG. 10 after the insulator at the innermost end of the trench has been etched.

Then the oxide or polysilicon at the most inwardly end of the trench/column 300 can be isotropically etched so as to reveal an aperture 202 in the oxide layer. The etching steps in FIGS. 10 and 11 have been shown as separate steps or processes. In such a regime a layer of resist may need to be placed over the second surface, but not in the trenches, so as to prevent the insulator 310 on the second surface from becoming further thinned. However it is also possible that the processing operations shown in FIGS. 10 and 11 can be performed in a single etching step or process.

Figure 12:
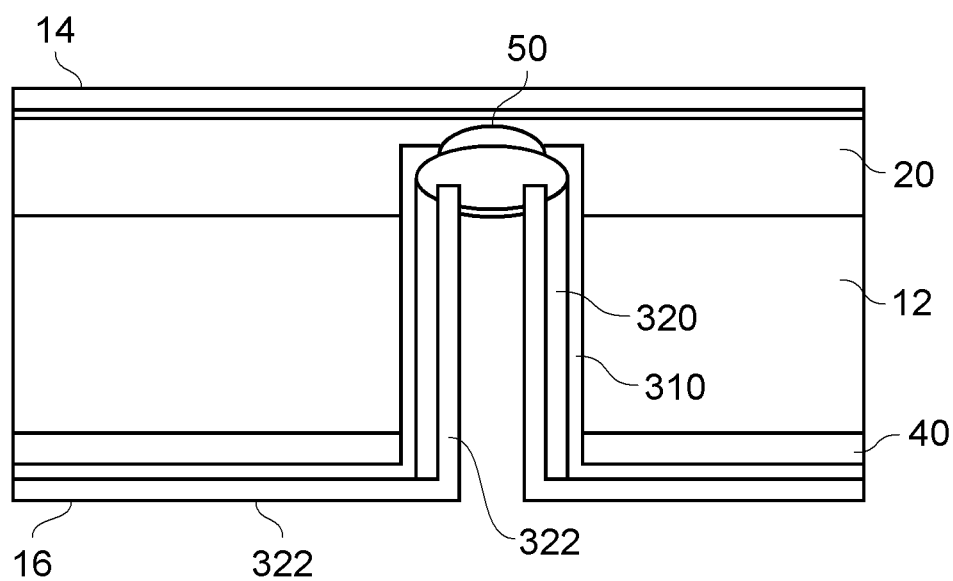
FIG. 12 shows the wafer of FIG. 11 after the formation of in situ polysilicon in the trench.
Figure 13:
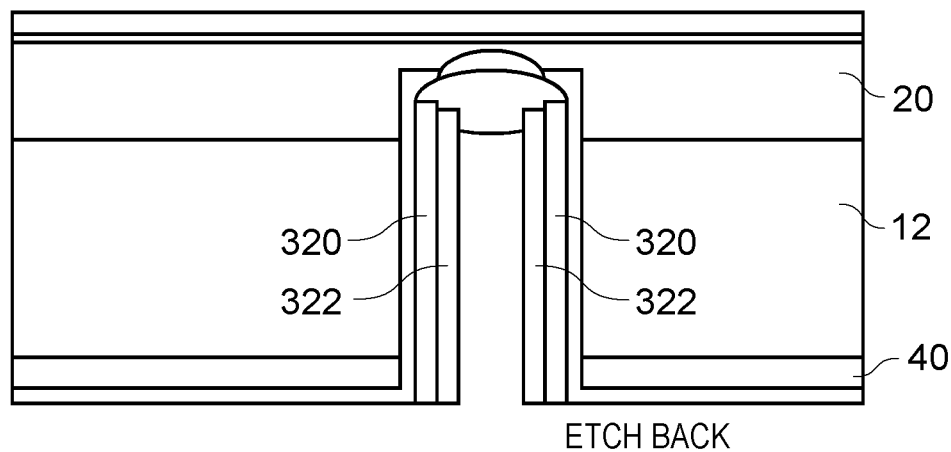
FIG. 13 shows the wafer of FIG. 12 after an etching step.
Figure 14:
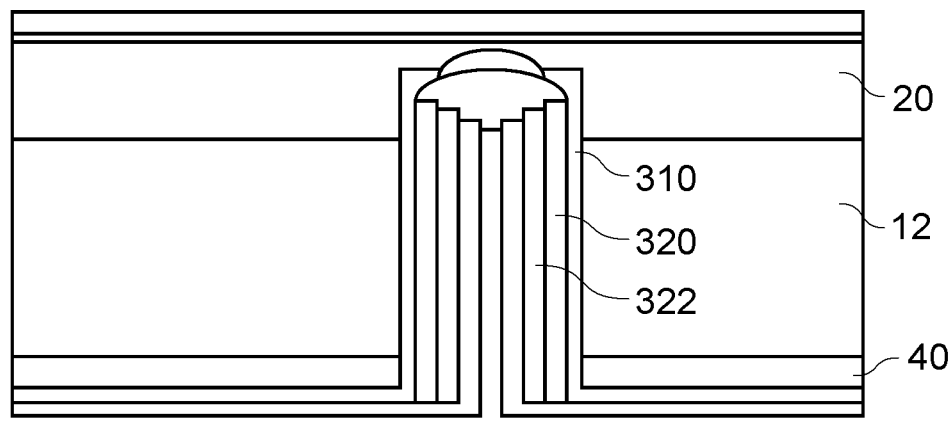
FIG. 14 shows the wafer of FIG. 13 after an in situ doped layer of polysilicon has been formed in the trench and also on the second side of the wafer.
Figure 15:
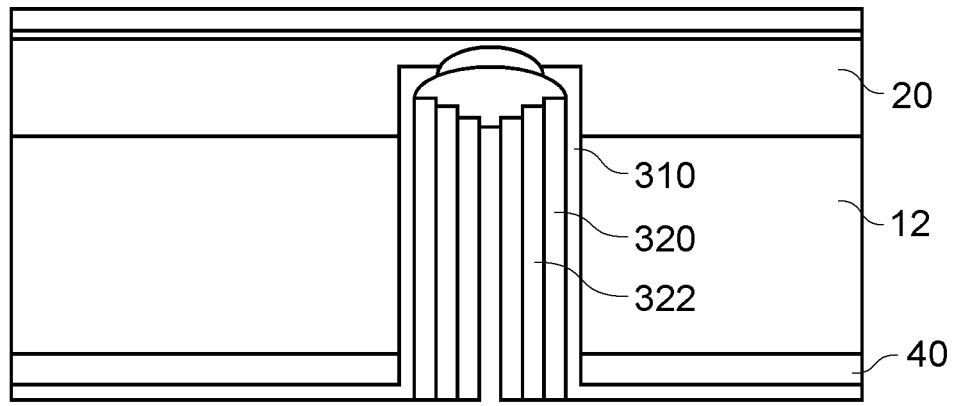
FIG. 15 shows the wafer of FIG. 14 after etching.
Figure 16:
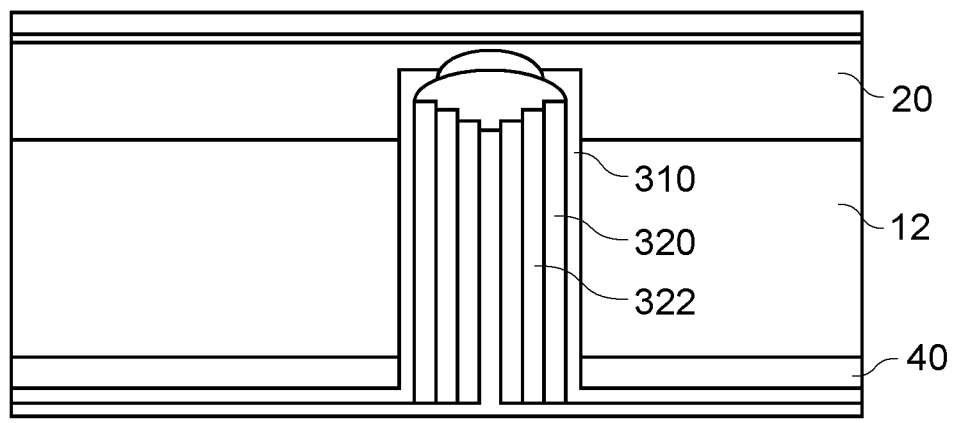
FIG. 16 shows the wafer of FIG. 15 after forming a further layer of in situ doped polysilicon.

Then, as shown in FIG. 12 a layer of polysilicon 322 is formed on the second surface 16 and on the inner wall of the trench/column 300. This is typically done by vapour phase deposition, possibly with in situ doping. The doping gives rise to the region 50 of the N++ doping at the end of the column.

This in situ doping has the effect of countering the P+ doping at the inner end of the trench, and consequently re-establishes a P-- or intrinsic region around the N++ region 50.

Subsequent steps or operations of etching back and in situ doped polysilicon deposition are performed so as substantially fill in the trench/column 300, as shown in FIGS. 13 to 16, whilst preventing the polysilicon from extending over the second side 16 of the wafer. Layers 320, 322 and the subsequently deposited doped polysilicon layers are all of the same material, and consequently form a single column 52 of conductive material as shown in FIG. 17.

Figure 17:
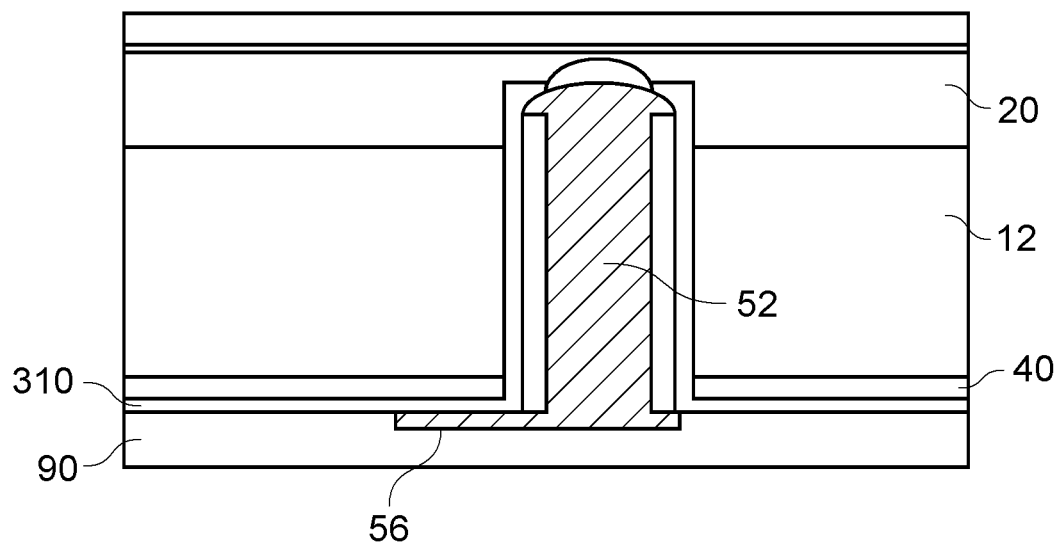
FIG. 17 shows the wafer of FIG. 16 after selective etching of the polysilicon and deposition of an insulating layer.

Next, and with reference to FIG. 17, a further layer of dielectric 90 is selectively deposited. In order to do this a mask (not shown) can be applied over the area of the doped polysilicon that will eventually form the foot 56 of the column 52. Next, in the illustrated process, the polysilicon is etched back a bit such that the oxide layer 310 is exposed, except in the region of the foot 56, then the dielectric layer 90 is deposited so as to arrive at the structure shown in FIG. 17.

The structure may then, if desired, be subjected to chemical mechanical planarisation, CMP, (as known to the person skilled in the art).

Figure 18:
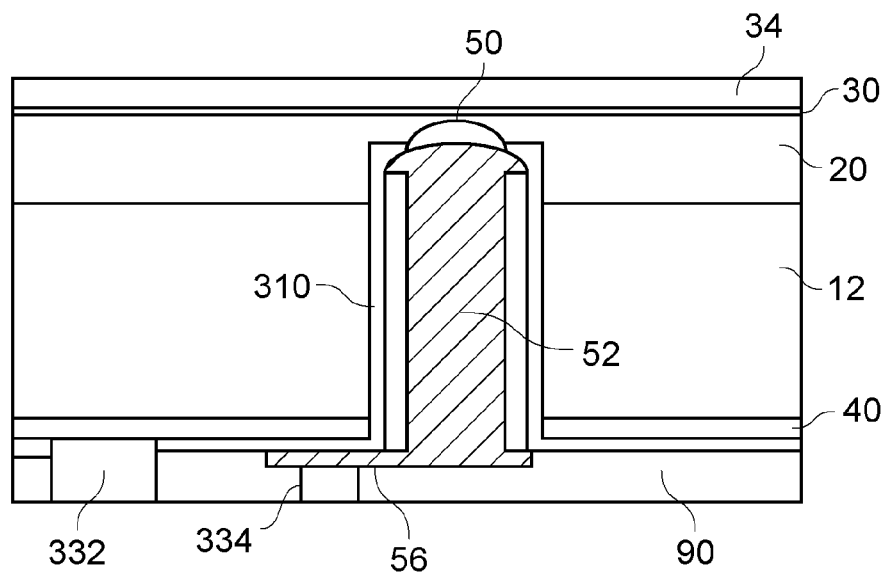
FIG. 18 shows the wafer of FIG. 17 after apertures have been made in selected portions of the insulating layer so as to allow electrical connections to extend through the insulating layer.

Then, in the illustrated process, the dielectric layer 90 is masked, and etched to form aperture 332 that extends to the heavily implanted layer 40 and aperture 334 that extends to the foot 56, as shown in FIG. 18.

Figure 19:
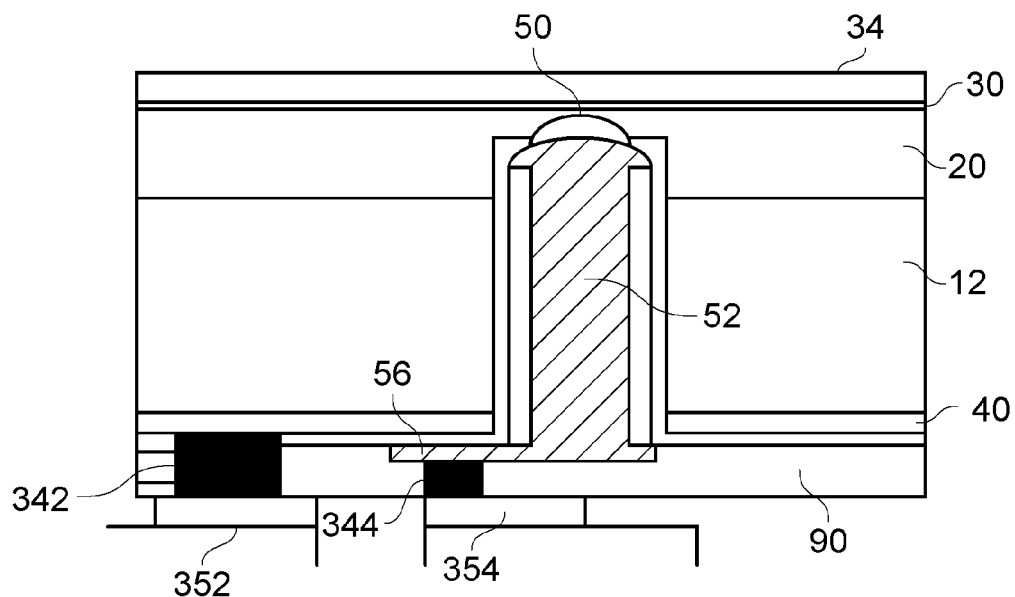
FIG. 19 shows the wafer of FIG. 18 after metallic connections have been made to the substrate and to the conductor in electrical contact with the photodiode.

Then, as shown in FIG. 19 metal contacts 342 and 344 are deposited into the apertures 332 and 334 respectively, and then, in the illustrate process, a connection layer is formed such that signals and power can be routed via conductive paths 352 and 354 between the photodetector and the other circuits, or a device interface.

It can be seen that the fabrication process, whilst not trivial, is not complex by integrated circuit fabrication standards, potentially requiring only one wafer flipping operation and only four masks.

Figure 20:
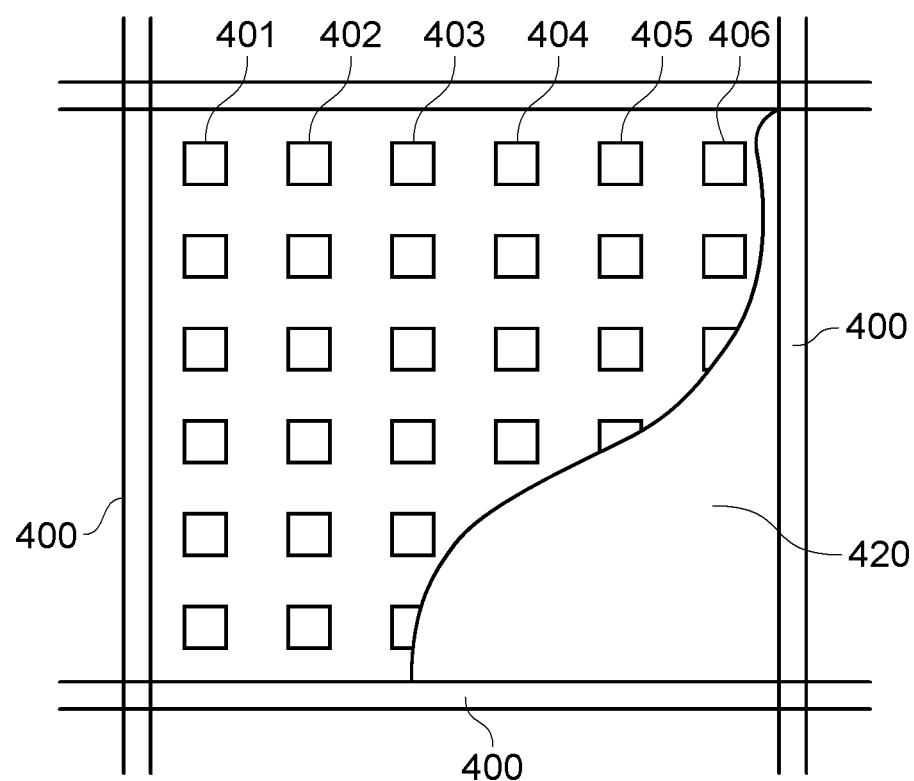
FIG. 20 is a plan view of a wafer in which a plurality of photodetectors have been assembled in a collaborative fashion so as to form a single pixel within an array.

As noted before, multiple single photodiodes may be formed in a spaced apart configuration and electrically connected together, either at the metallisation layer on the second side of the wafer or by way of a signal combining circuit. Such an arrangement is schematically illustrated in FIG. 20, which is a plan view of a pixel 420 of a photodetector, where each square 401 to 406 represents one of the photodetectors (more specifically a photodiode) described herein with respect to FIGS. 1 and 2. The pixel 420 may be a pixel within a larger photodetector array.

The gaps between adjacent photodetectors or photodiodes still contribute to the photodetector action because the depletion region around each first semiconductor region 50 extends towards adjacent photodetectors so photo-generated electron hole pairs are still influenced to travel in opposing directions rather than recombine, giving rise to a photo current. However the reduction in the overall size of the first semiconductor regions reduces the capacitance of each pixel 420.

Once pixels have been formed, it is advantageous to reduce or inhibit optical and/or electrical bleed though between adjacent pixels.

Optical isolation can be enhanced by the formation of discontinuities at the first side of the wafer. Such discontinuities may, for example, be in the form of trenches 400 formed in the first side of the wafer so as to delimit pixels, and to inhibit light arriving at the edge of one pixel from triggering a current in a neighbouring pixel. Such an arrangement is shown in plan view in FIG. 20. In FIG. 20, trenches 400 surround a plurality of photodetectors, of which only detectors 401 and 406 have been numbered for simplicity, and which cooperate to form a single pixel 420 within a detector array. Trenches may also be formed around single photodetectors.

Figure 21:
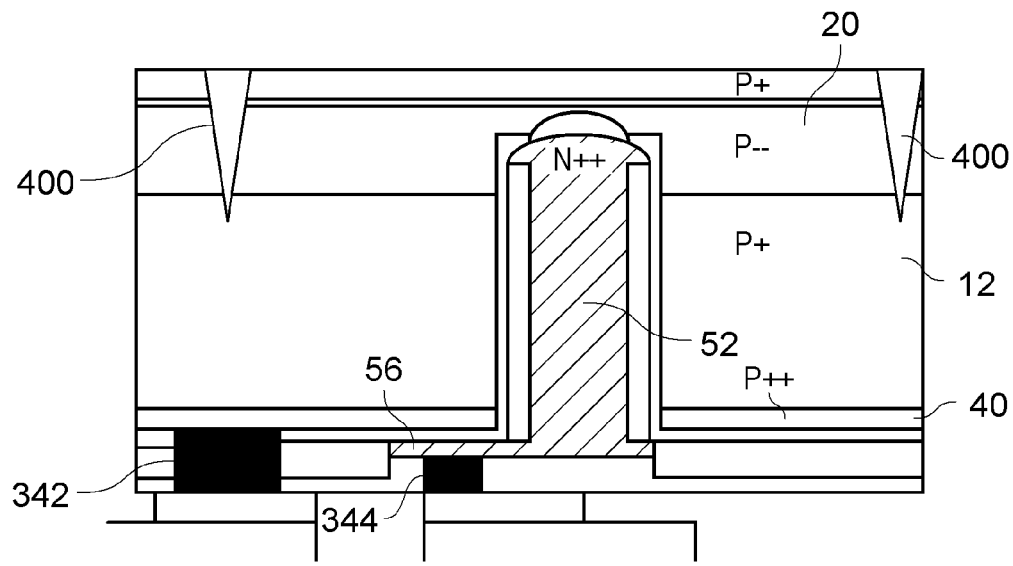
FIG. 21 is a schematic cross section showing how surface discontinuities can provide optical isolation between adjacent pixels.

FIG. 21 shows in cross-section how trenches 400 can be formed on the first side of the wafer. In order to simplify the figure only one photodiode has been shown. The trenches 400 are relatively shallow, and extend to, and just beyond, the depth of the buried PN junction within the wafer. In this example, the lowermost part of the trench extends just out of the P−− layer 20, and into the bulk region 12 of the wafer. Other depths, both shallower and deeper, are possible.

Figure 22:
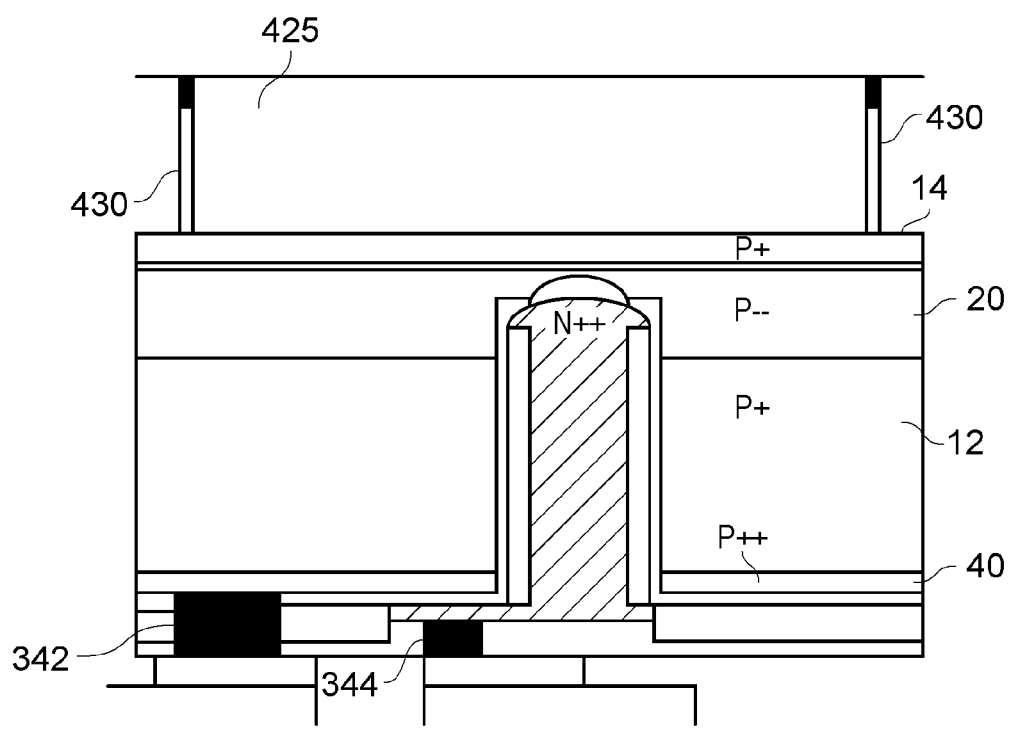
FIG. 22 shows an embodiment where optical isolation between adjacent photodetectors or adjacent pixels is provided by forming discontinuities or barriers on or above the first surface of the semiconductor substrate.

Other approaches to optical isolation can also be adopted. As one example, structures may be provided above the upper surface 14 to limit the acceptance range over which photons can impinge on the surface. Where the photodetectors are associated with scintillators, then discontinuities or barriers 430 may be formed within the scintillators 425, as shown in FIG. 22.

Figure 23:
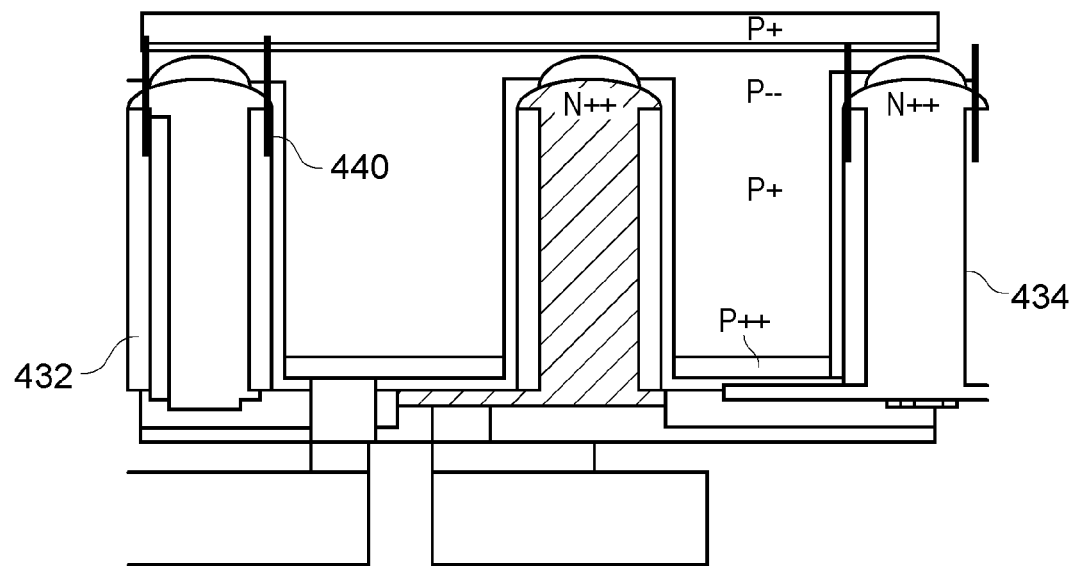
FIG. 23 shows a photodetector exhibiting both optical and electrical isolation between neighbouring photodiodes.

FIG. 23 shows a further variation in which both optical and electrical isolation can be achieved. Here three photodetectors are illustrated. The innermost or central one in the illustration can include any combination of features as hereinbefore described. However, by way of comparison, the left and right hand photodetectors 432 and 434 have been shown with trenches, or oxide, 440 which serves to provide both optical and electrical isolation.

The photodetectors 432 and 434 are effectively "dead" (non functioning) and serve merely to isolate a live photodetector from an adjacent live photodetector, which is adjacent the photodetector 432 and/or 434, and is not shown in FIG. 20.

Figure 24:
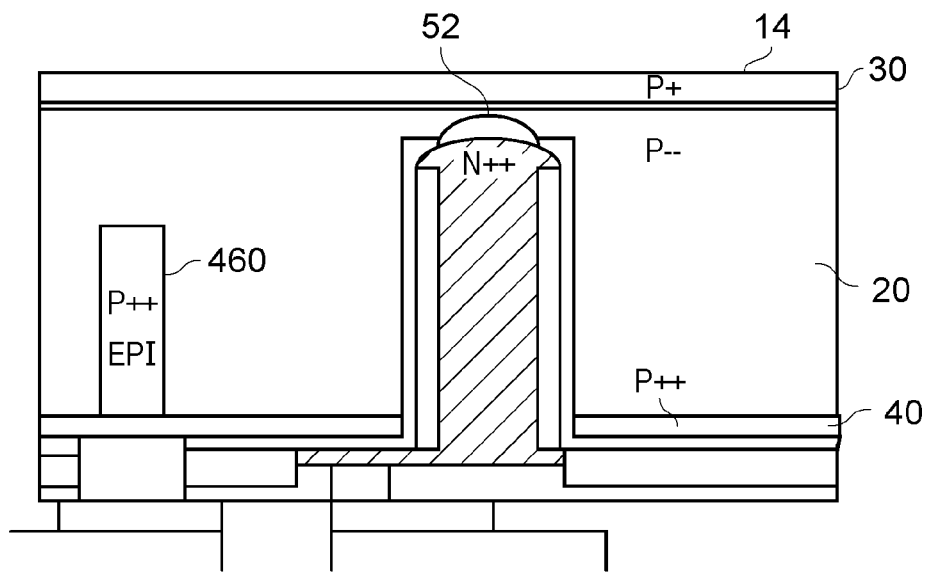
FIG. 24 shows another embodiment of a photodetector.

FIG. 24 shows a further embodiment of a photodetector, i.e. a photodiode, in combination with a semiconducting via. In many ways it is similar to the embodiment shown in FIG. 1. Rather than starting with P+ material 12 and forming a P−− layer 20 above it, the starting or bulk material is P−− semiconductor. The layer 40 of P++ materials can make a connection to the body of the device, now formed by the P−− semiconductor. However a region of P++ material 460 may be formed, for example by deposition within a trench, which can give both a discontinuity that provides optical isolation between adjacent photodetectors, and can also provide an additional region of high conductivity so as to enhance electrical connection with the bulk semiconductor, e.g. the P−− region.

It should be noted that the P and N type materials can be swapped in any of the embodiments described herein.

Figure 25:
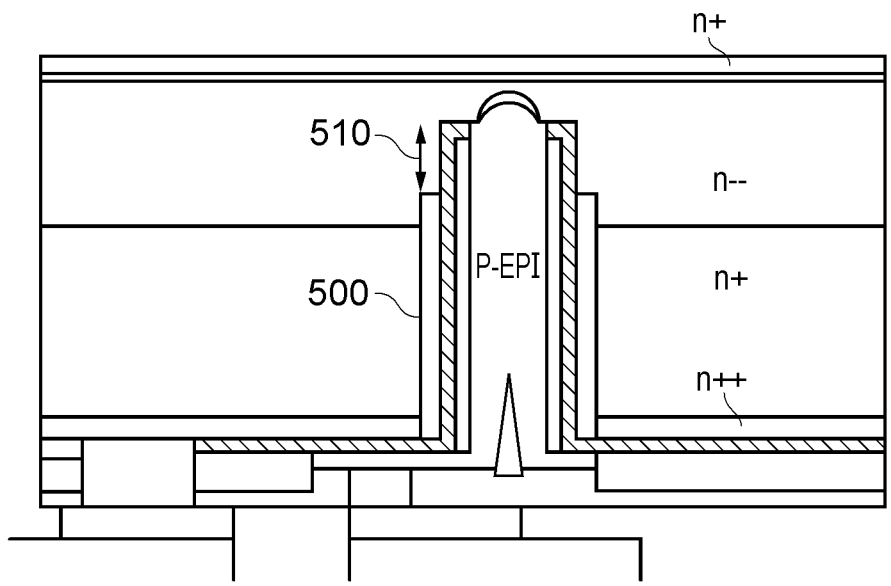
FIG. 25 shows a further embodiment of a photodetector.

FIG. 25 shows a further variation, which is similar to arrangement shown in FIG. 1, except that the body of the semiconductor substrate is a N-type material instead of a P-type. Additionally this embodiment has a reduced length of in-situ doped polysilicon 500 which stops short of the full depth of the conductor to the photodiode by a distance 510 corresponding to the depletion distance with the silicon.

It is thus possible to provide a semiconductor via in a wafer and as a result a photodetector that has the electrical and optical performance of a thin wafer, but with the use of a thicker wafer for robustness and relative ease of manufacture.

The technology was described in conjunction with particular embodiments. It will be understood, however, that the principles and advantages of the embodiments can be used for any other systems, apparatus, or methods with similar technical objectives.

Such methods, systems, and/or apparatus can be implemented into various electronic devices. Examples of the electronic devices can include, but are not limited to, consumer electronic products, parts of the consumer electronic products, electronic test equipment, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The words "coupled" or "connected", as generally used herein, refer to two or more elements that may be either directly connected, or connected by way of one or more intermediate elements. Additionally, the word "herein," and words of similar import, when used in this application, shall refer to this application as a whole and not to any particular portions of this application. Where the context permits, words in the Description of some Embodiments using the singular or plural number may also include the plural or singular number, respectively. The words "or" in reference to a list of two or more items, is intended to cover all of the following interpretations of the word: any of the items in the list, all of the items in the list, and any combination of the items in the list.

The teachings provided herein can be applied to other systems, not necessarily the systems described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

While claims have been drafted in single dependency format, it will be understood that each dependent claim may depend on any other claim of the same type, unless such a combination is clearly not feasible.

What is claimed is:

1. An integrated circuit comprising:
a sensor disposed adjacent a first side of a semiconductor substrate of a first type, the sensor comprising a sensor semiconductor region of a second type within the semiconductor substrate, and the sensor semiconductor region forming a PN junction with the semiconductor substrate;
a second element disposed at or adjacent to a second side of the semiconductor substrate, the second element comprising at least one of a device or a contact, and the second side of the semiconductor substrate being opposite the first side of the semiconductor substrate; and
an insulated conductor within the semiconductor substrate, the insulated conductor comprising a first region of doped semiconductor extending between and contacting the sensor and the second element, the first region of doped semiconductor being of the second type, and the first region of doped semiconductor material having a lower doping concentration than the sensor semiconductor region.

2. An integrated circuit as claimed in claim 1, in which an insulator is provided around an intermediate portion of the insulated conductor.

3. An integrated circuit as claimed in claim 2, in which the insulator comprises a layer of semiconductor oxide.

4. An integrated circuit as claimed in claim 2, in which the insulator comprises a layer of polysilicon.

5. An integrated circuit as claimed in claim 3, in which the insulator comprises a layer of silicon oxide in combination with a layer of polysilicon.

6. An integrated circuit as claimed in claim 2, further comprising a region of doped semiconductor around the insulator, the region of doped semiconductor region having a higher doping concentration than portions of the semiconductor substrate disposed between the region of doped semiconductor and the first side of the semiconductor substrate.

7. An integrated circuit as claimed in claim 1, in which the sensor is a photodetector, and the first side of the semiconductor substrate is configured to receive photons.

8. An integrated circuit as claimed in claim 7, in which the insulated conductor does not extend from the photodetector towards the first side of the semiconductor substrate.

9. An integrated circuit as claimed in claim 7, in which the semiconductor substrate around the sensor semiconductor region defines a first semiconductor substrate region which comprises the first type of semiconductor having a first dopant concentration, and the sensor semiconductor region comprises the second type of semiconductor having a dopant concentration greater than the first dopant concentration.

10. An integrated circuit as claimed in claim 1, further comprising barriers extending from the first side into a body of the semiconductor substrate.

11. An integrated circuit as claimed in claim 10, in which the barrier is an optical barrier comprising a trench formed in the semiconductor substrate.

12. An integrated circuit as claimed in claim 7, in which the semiconductor substrate is in electrical contact with a substrate contact on the second side of the semiconductor substrate, and a photodetector contact is on the second side of the semiconductor substrate.

13. An integrated circuit as claimed in claim 7, comprising a plurality of photodetectors formed within the semiconductor substrate, each having a respective conductor extending through the semiconductor substrate and away from the first side.

14. An integrated circuit as claimed in claim 13, in which the plurality of photodetectors are grouped together to form a pixel.

15. An integrated circuit as claimed in claim 14, in which the plurality of photodetectors which are grouped together to form a single pixel are electrically connected together.

16. An integrated circuit as claimed in claim 14, further comprising a plurality of pixels that include the pixel, and discontinuities at the first side of the semiconductor substrate, the discontinuities configured to inhibit light arriving at the edge of one pixel of the plurality of pixel from triggering a current in a neighbouring pixel of the plurality of pixels.

17. An integrated circuit as claimed in claim 9, in which the sensor semiconductor region is separated from the first side by at least some of the first semiconductor substrate region.

18. An integrated circuit as claimed in claim 1, wherein the semiconductor substrate comprises a bulk region surrounding the insulated conductor and a first semiconductor substrate region having a lower doping concentration than the bulk region, the first semiconductor substrate region forming the PN junction with the sensor semiconductor region.

19. An integrated circuit comprising:
a sensor disposed adjacent a first side of a semiconductor substrate of a first type, the sensor comprising a sensor semiconductor region of a second type formed within the semiconductor substrate;
a second element disposed at or adjacent a second side of the semiconductor substrate, the second element comprising at least one of a device or a contact, and the second side of the semiconductor substrate being opposite the first side of the semiconductor substrate;
a first semiconductor substrate region of the first type around the sensor semiconductor region, and the sensor semiconductor region having a higher doping concentration than a doping concentration of the first semiconductor substrate region;
a second semiconductor substrate region intermediate between the first semiconductor substrate region and the second side of the semiconductor substrate, wherein the second semiconductor substrate region comprises the first type of semiconductor with a doping concentration greater than the doping concentration of the first semiconductor substrate region; and
an insulated conductor within the semiconductor substrate and extending perpendicular to a plane of the semiconductor substrate on which the integrated circuit is fabricated, the insulated conductor comprising a first region of doped semiconductor extending between the sensor and the second element.

20. A sensor device comprising:
a semiconductor substrate having a first side and a second side, the first side being opposite the second side;
a sensor formed within the semiconductor substrate adjacent the first side of the semiconductor substrate, the sensor comprising a PN junction within the semiconductor substrate; and
a semiconductor via within the semiconductor substrate, the semiconductor via in direct and electrical contact with the sensor, or capacitively coupled thereto;
wherein the first side of the semiconductor substrate is configured to be exposed to a measurand traveling in a direction toward the second side of the semiconductor substrate, and wherein the semiconductor via extends between the sensor and the second side of the substrate.

21. A sensor as claimed in claim 20, wherein the semiconductor substrate comprises:
a first semiconductor substrate region that forms the PN junction with a sensor semiconductor region; and
a second semiconductor substrate region having a doping concentration that is greater than a doping concentration of the first semiconductor substrate region, the second semiconductor substrate region surrounding the semiconductor via.

22. A photosensitive device, comprising:
a semiconductor substrate having a first side and a second side, the first side opposing the second side;
a photodetector formed within the semiconductor substrate, the photodetector comprising a PN junction embedded in the semiconductor substrate; and
a conductor within the semiconductor substrate and in electrical contact with the photodetector, the conductor being intermediate between the photodetector and the second side of the semiconductor substrate;
wherein the photodetector is configured to sense photons received at a first side of the semiconductor substrate and moving toward the second side of the semiconductor substrate, and wherein the conductor extends between the photodetector and the second side of the semiconductor substrate.

23. A photosensitive device as claimed in claim 22, wherein the semiconductor substrate comprises:
   a first semiconductor substrate region of a first type that forms the PN junction with a photodetector semiconductor region; and
   a second semiconductor substrate region of the first type having a doping concentration that is greater than a doping concentration of the first semiconductor substrate region, the second semiconductor substrate region being disposed between the first semiconductor region and the second side of the semiconductor substrate.

24. A photosensitive device as claimed in claim 22, wherein the conductor comprises semiconductor material that is insulated from the semiconductor substrate.

* * * * *